United States Patent [19]

Nakamura et al.

[11] Patent Number: 5,774,742
[45] Date of Patent: Jun. 30, 1998

[54] PERIPHERAL DEVICE USING TWO MICROPROCESSORS AND TWO BUSES FOR AUTOMATICALLY UPDATING PROGRAM AFTER JUDGING THAT UPDATE DATA IS STORED IN A PORTABLE RECORDING MEDIUM

[75] Inventors: Takahiro Nakamura; Takafumi Oka, both of Odawara, Japan

[73] Assignee: Hitachi, Ltd., Tokyo, Japan

[21] Appl. No.: 389,596

[22] Filed: Feb. 16, 1995

Related U.S. Application Data

[63] Continuation-in-part of Ser. No. 179,200, Jan. 10, 1994.

[30] Foreign Application Priority Data

Feb. 16, 1994 [JP] Japan ................................. 6-019501
Jan. 11, 1995 [JP] Japan ................................. 5-002622

[51] Int. Cl.⁶ .................................................. G06F 13/00
[52] U.S. Cl. ........................... 395/828; 395/824; 395/825
[58] Field of Search ................................ 395/712, 652, 395/824, 825, 828; 360/46; 364/519; 336/92

[56] References Cited

U.S. PATENT DOCUMENTS

| | | | |
|---|---|---|---|
| 4,590,557 | 5/1986 | Lillie | 395/700 |
| 4,967,289 | 10/1990 | Kanota et al. | 360/46 |
| 5,210,875 | 5/1993 | Bealkowski et al. | 395/700 |
| 5,402,528 | 3/1995 | Christopher et al. | 364/519 |
| 5,418,945 | 5/1995 | Carter et al. | 395/600 |
| 5,455,926 | 10/1995 | Keele et al. | 395/404 |
| 5,487,161 | 1/1996 | Koenck et al. | 395/442 |

*Primary Examiner*—Frank J. Asta
*Assistant Examiner*—Le Hien Luu
*Attorney, Agent, or Firm*—Antonelli, Terry, Stout & Kraus, LLP

[57] ABSTRACT

When a portable recording medium is judged to have been loaded in a peripheral device, a microprocessor of the peripheral device checks whether the portable recording medium is a recording medium bearing update data for use updating a program to be executed by the micro-processor. If the portable recording medium is a recording medium bearing update data for updating such a program, the update data is read from the portable recording medium and the program is updated in accordance with the read update data. If, however, the portable recording medium is not a recording medium bearing update data for updating a the program, the recording medium is ejected from the peripheral device. The program in the peripheral device can thus be updated even if the peripheral device is not connected to a host computer.

9 Claims, 6 Drawing Sheets

| LOGICAL TRACK ADDRESS | ZONE NAME | | | | | |
|---|---|---|---|---|---|---|
| -2520 TO -1261 | LEAD IN ZONE | | | | | |
| -1260 TO -421 | SFP ZONE | SFP1 | SFP2 | SFP3 | SFP4 | ··SFP59 OR 105 |
| -420 TO -1 | MANUFACTURER'S ZONE | 13 | | | | |
| 0 TO 55769 | USER ZONE | DMA1 | | DMA2 | | |
| | | USER AREA | | | | |
| | | DMA3 | | DMA4 | | |
| 55770 TO 56483 | MANUFACTURER'S ZONE | | | | | |
| 56484 TO 56738 | SFP ZONE | SFP1 | SFP2 | SFP3 | SFP4 | ··SFP30 OR 51 |
| | TRANSITION ZONE | | | | | |
| | PEP ZONE | PEP | | PEP | | PEP |
| | REFLECTIVE ZONE | | | | | |

FIG.2

(512-BYTE/SECTOR)

| BYTE No. | DEFINITION | SET VALUE | |
|---|---|---|---|
| 2 | MEDIUM ID CODE | (FF) H | |
| 77 | PROGRAM REVISION BEFORE UPDATE | (00) H | |
| 78 | PROGRAM REVISION AFTER UPDATE | (01) H | |
| 79 ⋮ 82 | RECORD START TRACK NOS. AND SECTOR NO. OF UPDATE CONTROL DATA AND UPDATE DATA | TRACK NO. #H | (00) H |
| | | TRACK NO. #M | (00) H |
| | | TRACK NO. #L | (00) H |
| | | SECTOR NO. # | (00) H |
| 83 ⋮ 86 | RECORD END TRACK NOS. AND SECTOR NO. OF UPDATE CONTROL DATA AND UPDATE DATA | TRACK NO. #H | (00) H |
| | | TRACK NO. #M | (00) H |
| | | TRACK NO. #L | (09) H |
| | | SECTOR NO. # | (4F) H |
| 87 ⋮ 90 | RECORD START TRACK NOS. AND SECTOR NO. OF UPDATE CONTROL DATA AND UPDATE DATA (FOR CONFIRMATION) | TRACK NO. #H | (00) H |
| | | TRACK NO. #M | (01) H |
| | | TRACK NO. #L | (00) H |
| | | SECTOR NO. # | (00) H |
| 91 ⋮ 94 | RECORD END TRACK NOS. AND SECTOR NO. OF UPDATE CONTROL DATA AND UPDATE DATA (FOR CONFIRMATION) | TRACK NO. #H | (00) H |
| | | TRACK NO. #M | (01) H |
| | | TRACK NO. #L | (09) H |
| | | SECTOR NO. # | (4F) H |

PERIPHERAL DEVICE USING TWO MICROPROCESSORS AND TWO BUSES FOR AUTOMATICALLY UPDATING PROGRAM AFTER JUDGING THAT UPDATE DATA IS STORED IN A PORTABLE RECORDING MEDIUM

CROSS-REFERENCE TO RELATED APPLICATION

This is a Continuation-in-part of co-pending application Ser. No. 08/179,200 filed Jan. 10, 1994, pending; the subject matter of which is incorporated herein by reference.

BACKGROUND OF THE INVENTION

1. Field of the Invention

The present invention relates to update control programs to be executed by a microprocessor, and more particularly to a method of automatically updating control programs for a microprocessor of a peripheral device to be connected to a host computer or other systems, and to a computer peripheral device.

2. Description of the Related Art

Rapid developments in computer technology often necessarily require corresponding improvements in the functions of peripheral such as an optical disc drive. Improving the functions of a peripheral device is generally performed by changing a control program executed by a microprocessor built into the peripheral device.

In changing a control program for a peripheral device, generally a read-only memory (ROM) storing the control program is replaced with a new ROM storing an updated program. In such a case, either the peripheral device is required to be carried to a maintenance center to exchange its ROM, or a maintenance person is required to call on the place where the peripheral device is installed to exchange its ROM.

If a control program written in an electrically erasable programmable ROM (EEPROM) as disclosed in JP-A-63-239697 is to be updated, a dedicated rewriting device (programmer) is used. Also in this case, either the peripheral device is required to be carried to a maintenance center to update the contents of its ROM, or a maintenance person is required to visit the site where the device is located so that he can use a dedicated rewriting device and call on the where the peripheral device is installed to update the contents of its ROM. If the peripheral device is carried to a maintenance center, it is necessary for a user to acquire a substitute for it so that operation of the computer to which it is connected can continue.

In most of personal computers which employ a floppy disk drive (FDD), a floppy disk written with an application program is loaded in the FDD and the program is stored in a random access memory (RAM) so that a processor may execute it. If the application program is to be updated, another floppy disk written with an updated application program is often required to be loaded and a proper command is entered to store the updated application program. In this case, however, the basic input/output system (BIOS) of the personal computer cannot be changed, only the application program or operating system (OS) can. There is therefore a need for a peripheral device whose control program can be automatically updated by loading a portable, program-bearing storage medium into the peripheral device to effect an update of a control program of that device, to thereby change the functions the device is to perform.

SUMMARY OF THE INVENTION

It is an object of the present invention to provide a method of readily updating/changing a control program to be executed by a microprocessor built into a computer peripheral device. It is another object of the present invention to provide a peripheral device for a computer which is adapted to receive a program-bearing storage medium which can be read and then executed by a microprocessor built into the peripheral device to thereby readily update/change a control program of the peripheral device to produce a corresponding change in the functionality of the device It is another object of the invention to provide a method of updating a control program to be executed by a microcomputer built into a computer peripheral device, without having to connect the peripheral device to a higher level (host) computer.

The above objects of the invention may be achieved by detecting that a recording medium storing an update control program has been loaded in a peripheral device, and by making a microprocessor of the peripheral device overwrite the update control program in a rewritable memory for the microprocessor.

Two microprocessors may be used in a peripheral device. One of the microprocessors updates the control program of the other microprocessor after a recording medium storing an update control program is loaded in the peripheral device.

Preferably, an identification code of a recording medium storing an update program is recorded in a specific track of the medium. In this case, the update program is loaded in a rewritable memory when the identification code is detected.

Alternatively, a discriminator such as a hole or a recess representing a medium storing an update control program is formed on the medium itself or its housing. In this case, when the discriminator is detected, the update program is automatically loaded.

The usable memory is a memory capable of being accessed at a high speed and being electrically rewritten, such as a flash EEPROM. The invention may be applied to a system having a plurality of micro-processors, e.g., two microprocessors. In this case, the contents of a memory of one microprocessor are updated under control of the other microprocessor.

The invention provides means for updating a program stored in a memory for a microprocessor of a peripheral device by loading an update program in the memory after it is detected that a portable recording medium storing the update program has been loaded in the peripheral device.

Therefore, a particular maintenance tool for a peripheral device is not necessary on the side of a host computer. Such a maintenance tool includes starting a program update operation in response to a specific command from the host computer connected to a peripheral device and transferring program update data from the host to the peripheral device via an interface.

The present invention also advantageously removes the necessity of having a user carry the peripheral device to a maintenance center. Instead, a user receives a recording medium storing an update program by mail or the like, and simply loads the recording medium storing the update program into the peripheral device. The update program is then automatically loaded in a memory of the peripheral device independently from a host computer connected to the peripheral device (i.e., without any notice to or from the host).

With only a simple user manipulation, the program update can be performed at any time in a short period of time. The portable recording medium may be adapted to be automatically ejected after the completion of the update operation.

The reliability of the update operation can be improved by duplicating, triplicating, or quadruplicating the identification code representative of a recording medium storing an update program, and/or by duplicating the update control data and update program data. The reliability of the update operation can also be improved by checking a program revision or version.

BRIEF DESCRIPTION OF THE DRAWINGS

FIG. 2 is a table showing an example of byte definitions of the areas of the format shown in FIG. 1B.

DESCRIPTION OF THE PREFERRED EMBODIMENTS

Figures 1A, 1B:
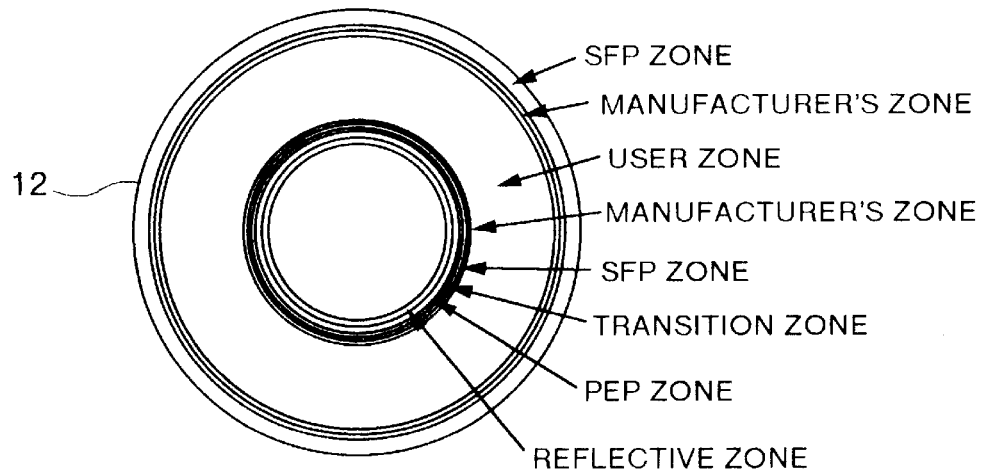
FIG. 1A is a diagram illustrating the data record state of an optical disc which is one example of portable recording media.
FIG. 1B is a table showing an example of the format of the optical disc shown in FIG. 1A.

An optical disc 12 is shown in FIG. 1A as one example of portable recording media. As shown in FIG. 1A, a number of tracks are formed concentrically on the surface of the optical disc 12. Each track is assigned a logical track address. In the example shown in FIG. 1A, the track address at the outermost circumference is −2520, the address being incremented by 1 as the track moves toward the inner circumference.

FIG. 1B shows the medium format of the optical disc 12 shown in FIG. 1A. The medium format is constituted by several zones. Of these zones, a user zone 13 is defined to be located from the track address 0 to 55769. User data is written in a user area 14 of the user zone 13. Four defect management areas (DMAs) DMA1 to DMA4 are disposed at predetermined sectors of predetermined tracks before and after the user data. Each of DMA1 to DMA4 is written with a disc definition structure (DDS) including a primary defect list (PDL) and a secondary detect list (SDL). The same data is recorded in each of DMA1 to DMA4 in quadruplicate in order to avoid a data read error to be caused by defects of the optical disc. An undefined byte region is reserved after the DDS defining byte region. In this embodiment, this undefined byte region is written with an identification code of a recording medium storing an update control program as well as control data necessary for carrying out the update operation.

Other zones shown in FIGS. 1A and 1B include a lead-in zone, standard formatted part (SFP) of the control tracks zones, manufacturer's zones, a transition zone, a phase-encoded part (PEP) of the control tracks zone, a reflective zone, and the like. These zones are not directly related to the invention, and so the detailed description thereof is omitted.

Examples of a medium identification code and control data to be written in the DDS undefined byte region are shown in FIG. 2.

In the undefined byte region shown in FIG. 2, a byte No. 2 corresponds to an area in which is a medium identification code is written indicating that the recording medium is used to update a control program. In this embodiment, (FF) H (hexadecimal) is written. A byte No. 77 is an area written in which is a program revision or version (in this embodiment, (00) H) of a control program before the update (i.e., a control program to be updated by this update program optical disc). A byte No. 78 is an area written in which is a program revision (in this embodiment, (01) H) of a control program after the update (i.e., a control program written in this update program optical disc).

Bytes Nos. 79 to 82 corresponds to areas in which are record start track Nos. their sector No. of update control data and update data are written on the optical disc. Similarly, bytes Nos. 83 to 86 corresponds to areas written in which are record end track Nos. their sector No. of the update control data and update data are written on the optical disc.

The same data stored 283 in the areas corresponding byte Nos. 79 to 82 and the byte Nos. 83 to 86 is stored in the areas corresponds to byte Nos. 87 to 90 and byte Nos. 91 to 94, respectively, for confirmation purposes.

In the tracks and sectors of the optical disc 12 designated by the above-described byte areas, a ROM area to be updated, the number of bytes to be updated, and a program revision after the update, are written in one sector, and in the sectors following this one sector, update data is written.

An update operation of a control program using the optical disc shown in FIGS. 1A and 1B will be described with reference to an embodiment of an optical disc drive unit shown in FIG. 3.

Figure 3:
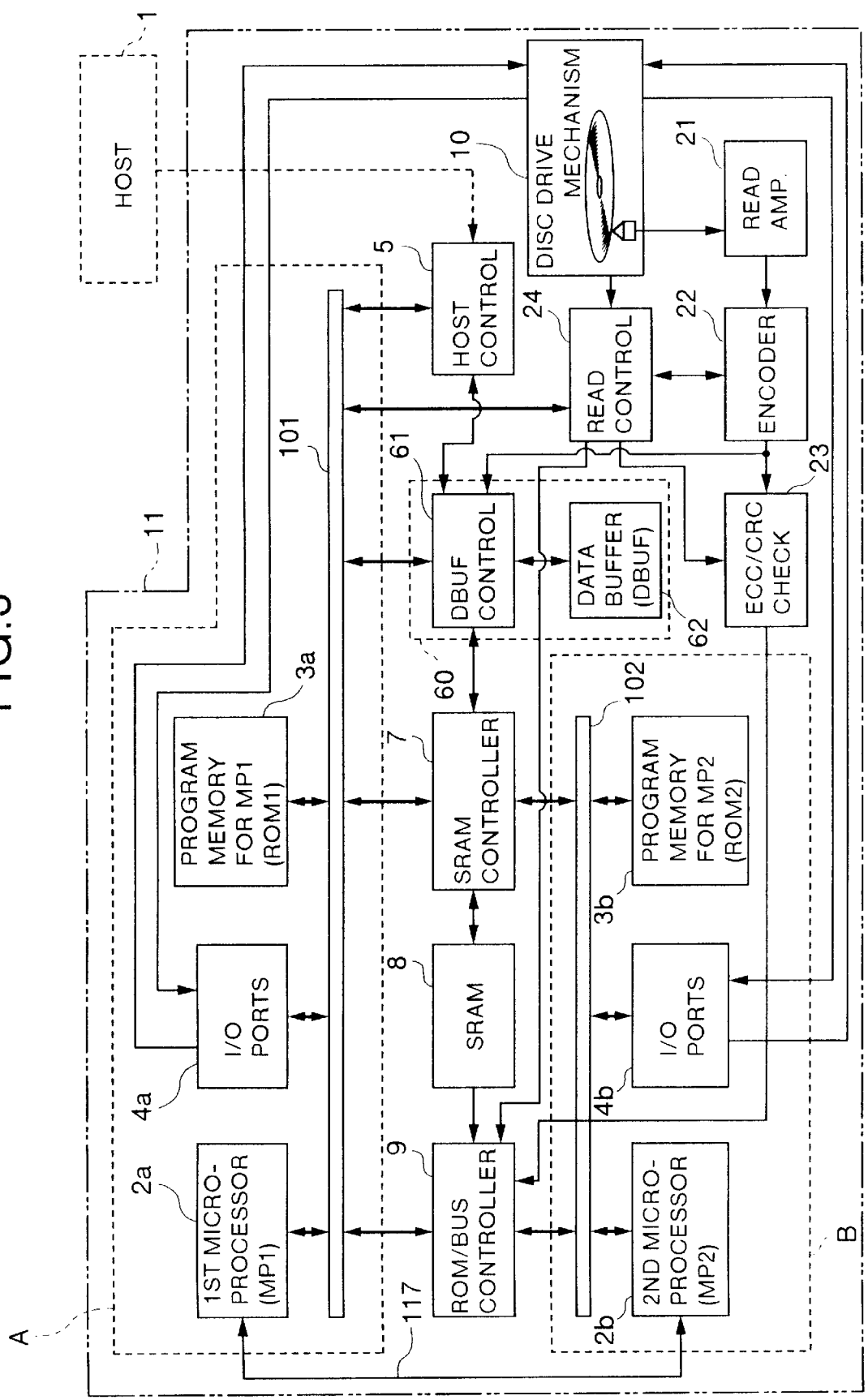
FIG. 3 is a schematic block diagram showing the structure of an optical disc drive unit according to an embodiment of the invention.

FIG. 3 shows an optical disc drive unit 11 connected to a host computer 1 in an ordinary case for reading user data from a portable recording medium 12 in response to a command from the host computer 1.

Referring to FIG. 3, the optical disc drive unit 11 includes a first microprocessor A (MP1) 2a and a second microprocessor B (MP2) 2b. A system A controls a data read operation of an optical disc drive mechanism 10, a system B controls a drive operation of the head of the drive mechanism 10.

The system A includes the first microprocessor (MP1) 2a, a program memory (ROM1) 3a for storing an executable program (control program) of MP1, an I/O port 4a for data input/output to and from the external of the system A, and a system bus 101 connected to MP1, ROM1, and I/O port 4a.

The system B includes the second microprocessor (MP2) 2b, a program memory (ROM2) 3b for storing an executable program (control program) of MP2, an I/O port 4b for data input/output to and from the external of the system B, and a system bus 102 connected to MP2, ROM2, and I/O port 4b.

Data transfer between the host 1 and the optical disc drive unit 11 is generally performed by a host controller 5 connected to the system bus 101. Data received at the host controller 5 is temporarily stored in a data buffer (DBUF) 62 of a data buffer circuit 60 via a data buffer controller 61 of this circuit 60.

Data in the DBUF 62 is written in a shared memory 8 constituted by a static RAM (SRAM) by an SRAM controller 7. Data in the SRAM 8 can be transferred onto the system buses 101 and 102 of the systems A and B by a ROM/bus controller 9.

In this invention, the host 1 is not necessarily required to be connected to the optical disc drive unit 11. The optical disc drive unit 11 is adapted to automatically read data from the optical disc 12 when the optical disc 12 is loaded, under the control of a read controller 24 and with the help of a read amplifier 21, an encoder 22, and a DBUF controller 61. In this manner, a program stored in the optical disc drive unit 11 can be updated (rewritten), irrespective of whether the host 1 is connected or not and irrespective of the type of the host 1.

The program update operation will be described in more detail with reference to FIGS. 3, 4, and 5.

When the update program recording medium 12 is inserted, MP1 starts a medium loading operation. A data read head seeks a track position where DMA is recorded, and reads the contents of DMA. Similar to reading user data, in reading the contents of DMA, a signal read from the medium 12 is encoded by using the read amplifier 21 and encoder 22. The encoded data is stored in DBUF 62 via the DBUF controller 61. The validity of the read data is checked by an error correction code (ECC)—cyclic redundancy check (CRC) circuit 23.

In response to a command signal from MP1, the read controller 24 supplies an encoding timing to the encoder 22 and a check timing to the ECC/CRC circuit 23. Error data during the encoding operation by the encoder 22 is stored in the shared memory 8 via the ECC/CRC circuit 23 and SRAM controller 7, and check result data is stored in the shared memory 8 via the SRAM controller 7.

Figure 4:
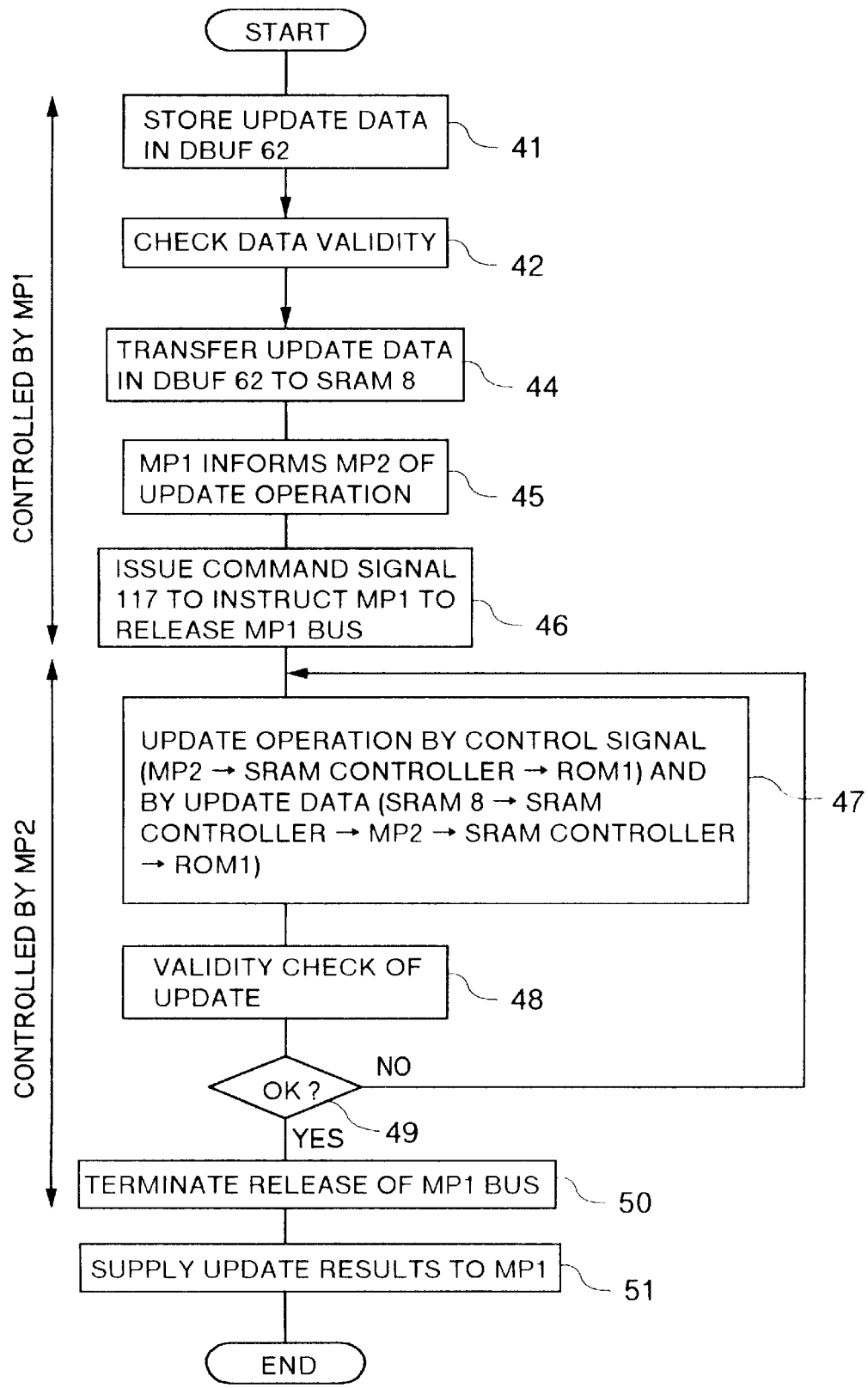
FIG. 4 is a flow chart explaining the control program update operation to be executed by the optical disc drive unit shown in FIG. 3.

The validity check at Steps 41 and 42 shown in FIG. 4 includes the following operations. In accordance with the error data and check result data, MP1 judges whether the read data is correct or not (Step 41 in FIG. 4: Step 411 in FIG. 5). Data correctable by ECC is judged that the read data is correct. If MP1 judges that the read data is not correct, the operation of reading the contents of DMA of the medium 12 is again performed (Step 411 in FIG. 5).

If it is judged that the read data is correct, the above-described operations are repeated, and MP1 checks whether or not all data read from DMA1 to DMA4 are correct (Step 42 in FIG. 4: Step 412 in FIG. 5).

Figure 5:
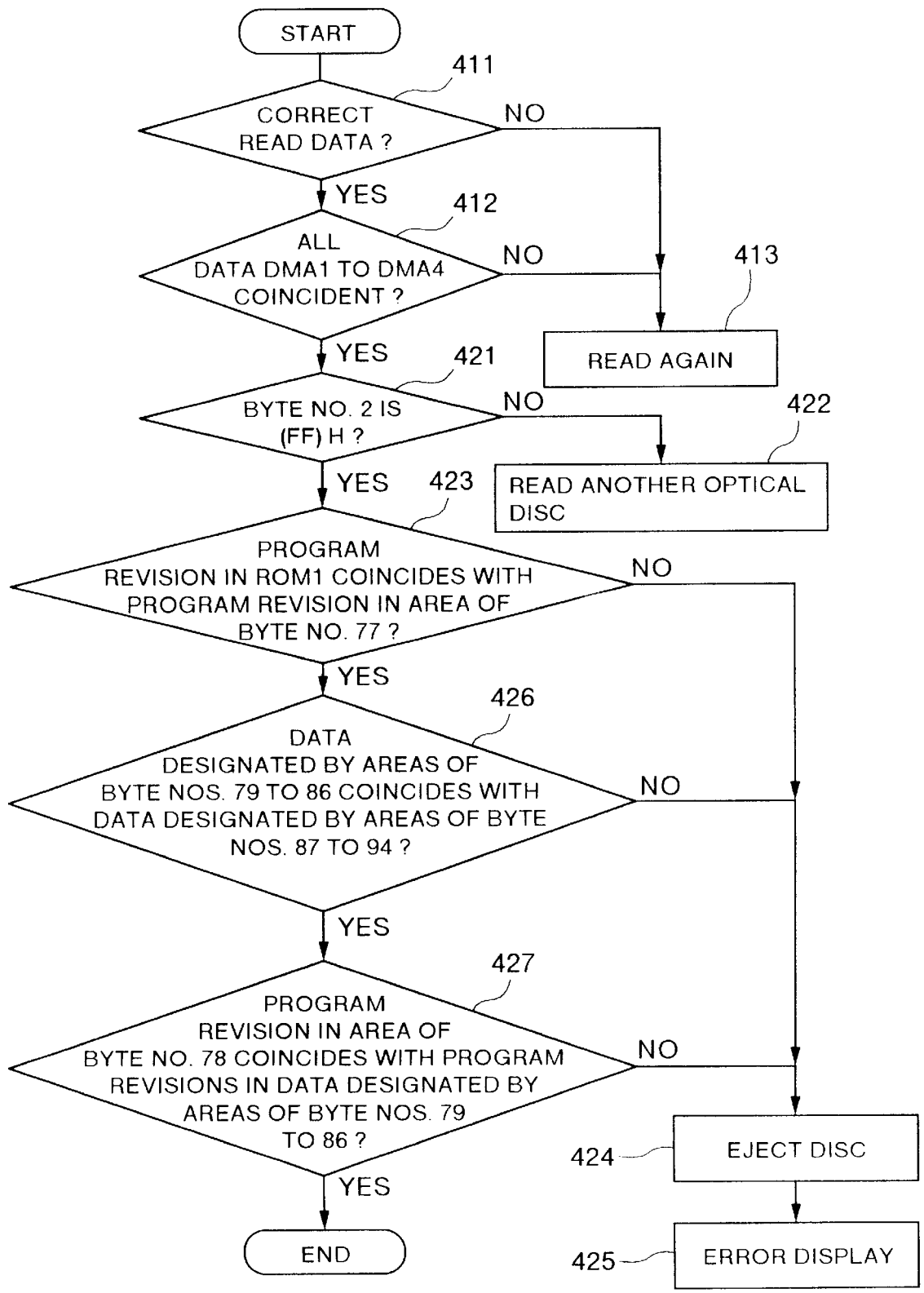
FIG. 5 is a flow chart explaining the main operation of the control program update operation given in the flow chart of FIG. 4.

If all the data are not coincident, the read operation is again performed (Step 413 in FIG. 5), but if all the data are coincident, it is checked whether the area of the byte No. 2 of the DDS shown in FIG. 2 has stored therein a hexadecimal number of (FF) H (Step 421 in FIG. 5). If not, an ordinary operation process for a recording medium is performed (Step 422 in FIG. 5).

If (FF) H, the inserted medium is recognized to be an update program recording medium, and it is checked whether the revision (of a program to be updated) stored in the memory ROM1 is coincident with a program revision (a revision one revision before the update program) stored in the area of the byte No. 77 of DDS (Step 423 in FIG. 5). If both the revisions are not equal, the program update operation is not performed and the medium 12 is ejected (Step 424 in FIG. 5). An error display is given thereafter by using a conventional "ready" display of the drive unit 11 (Step 425 in FIG. 5). If both the revisions are equal, the update control data and update data are read from the tracks and their sector designated in the areas of the byte No. 79 and following Nos. of DDS, in the manner similar to the above-described DDS reading.

In this case, it is checked whether the update control data and update data are coincident with the confirmation data (update control data and update data stored in the confirmation areas of the byte Nos. 87 to 94 of the recording medium 12 (Step 426 in FIG. 5). If not coincident, similar to the above, the recording medium 12 is ejected (Step 424 in FIG. 5) and an error display is given (Step 425 in FIG. 5). If coincident, it is checked whether the program revision after the update stored in DDS of the recording medium 12 is coincident with the program revision after the update contained in the update control data (Step 427 in FIG. 5). If not coincident, the medium 12 is ejected (Step 424 in FIG. 5) and an error display is given (Step 425 in FIG. 5).

If coincident, MP1 transfers the update control data and update data stored in DBUF 62 via the MP1 bus 101 to SRAM 8, and stores the update instruction contents of ROM 1 (addresses of data update in ROM1 or the like) in SRAM 8 (Step 44 in FIG. 4). Next, MP1 issues a command signal 117 to MP2 to instruct update start of ROM1 (Step 45 in FIG. 4). In response to the command signal, MP2 checks the instruction contents in SRAM 8 and issues a command signal 117 to instruct MP1 to release the MP1 bus 101 (Step 46 in FIG. 4). After the release of the bus 101, a data update operation for ROM1 is performed via the SRAM controller 7 and MP1 bus 101 in accordance with the update control data and update data (Step 47 in FIG. 4).

After completion of the program update of ROM1, the changed update control data and update data in ROM1 are compared with the update control data and update data stored in the recording medium to check the coincidence therebetween (Step 48 in FIG. 4) If not coincident, the above operations are again performed.

After the update operation is completed, the update results are stored in SRAM 8, and a command signal 117 is issued to instruct MP1 to terminate the release of the MP1 bus 101 and read the update results. MP1 then check the update results. If MP1 judges that the update operation has been executed normally, the medium 12 is ejected and a normal execution display is given by using the conventional "ready" display of the drive unit 11. After this display, both MP1 and MP2 are set to the initial state (Step 51 in FIG. 4). If it is judged that the update operation has been executed abnormally, MP1 instructs MP2 to perform the update operation once more.

The update operation for ROM1 has been described above. The update operation for ROM2 can be performed in a similar manner by issuing a command from MP2 to MP1.

The portable recording medium 12 can thus be automatically ejected after the completion of updating a microprocessor program.

In the above embodiment, an identification code is recorded in a specific track of a portable recording medium 12 such as an optical disc so as to indicate that this medium is an update program medium. Instead of this identification code, a discriminator such as a hole or a mark may be formed on the recording medium itself, or alternatively a discriminator such as a hole, a recess, or a mark may be formed on a housing (such as a cartridge of an optical disc or a magneto optical disc, and a cassette of a magnetic tape). A mechanism for detecting such a discriminator may then be mounted on the medium loading position of a drive unit.

Figure 6:
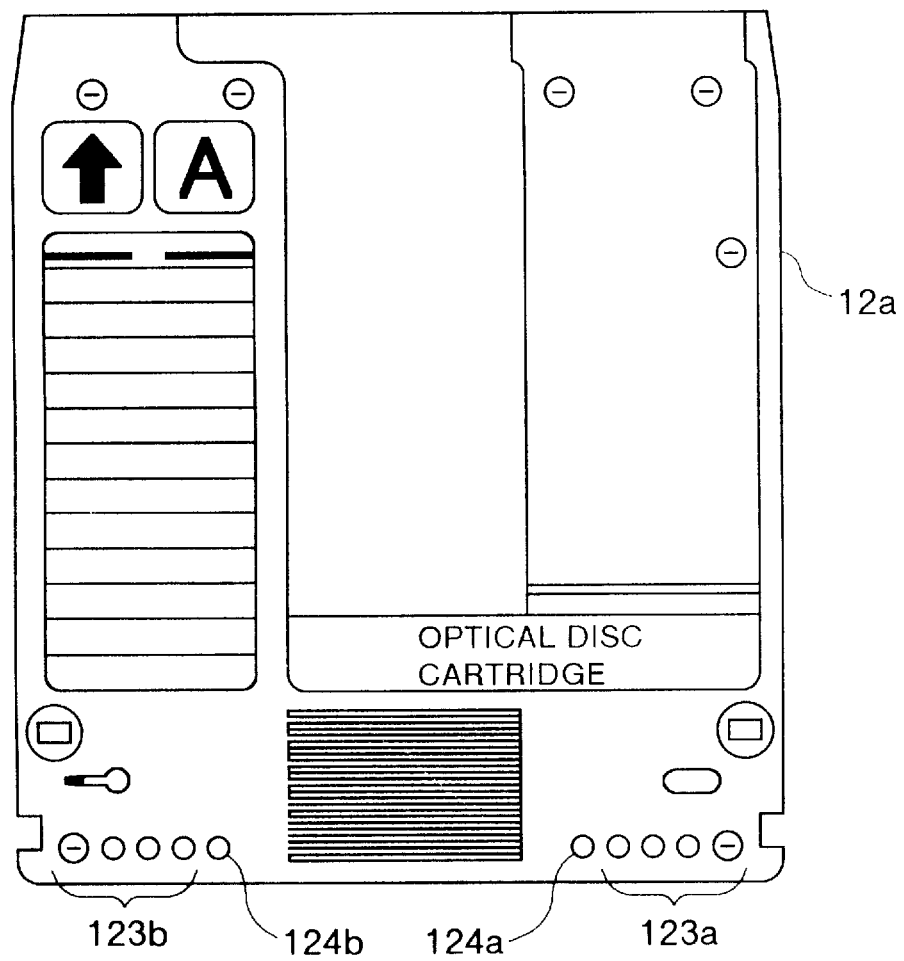
FIG. 6 is a plan view of an optical disc cartridge showing another example of how a recording medium storing an update program is identified.

FIG. 6 shows an example of an optical disc cartridge provided with such a discriminator hole. In FIG. 6, a cartridge 12a is formed with various types of discriminator holes 123a and 123b (holes are formed on both sides of the disc cartridge because both the sides of the optical disc are used). Holes 124a and 124b are formed in line with the holes 123a and 123b. These holes 124a and 124b are detected by a sensor (not shown). It is therefore possible to identify that this optical disc is an update program recording medium.

In this manner, when the portable recording medium 12 is loaded in the drive unit 11, the medium 12 can be identified to be an update program recording medium, before the data of the medium 12 is reproduced. Therefore, a simple mechanism allows to detect an update program recording medium earlier than reading the specific track, so that the following program update process can be speeded up. Furthermore, a mechanism for sensing an insertion of a portable recording medium may be mounted on a drive unit so that when the medium is inserted, all the microprocessor program update operations can be automatically performed.

As described so far in detail, the present invention is also a method for updating a program stored in a memory for a microprocessor of a peripheral device by automatically loading an update program in the memory of for the peripheral device after it is detected that a portable recording medium storing the update program has been loaded in the peripheral device. Therefore, when a user simply loads the recording medium storing the update program in the peripheral device, the update program is loaded in the memory independently from the host (without any notice to or from the host). With only a simple user manipulation, the program to be executed by the microprocessor can be updated automatically and at a high speed.

Since an identification code of an update program medium is written in a specific track of the medium or a discriminator is formed on the medium itself or medium housing, the identification code or discriminator is automatically detected when the medium is loaded and the update program can be automatically loaded in the memory of the peripheral device. With a simple structure, the automatic update becomes possible. If the discriminator is formed on the medium or medium housing, it is possible to identify an update program recording medium immediately when it is loaded, before the contents of the medium is reproduced, and to speed up the update operation.

Update of a program in a memory of one of a plurality of microprocessors may be performed under the control of another microprocessor. In this case, by using an idle time of the microprocessor with the memory storing the program to be updated, it becomes possible to update the program flexibly, reliably, and quickly without any malfunction.

What is claimed is:

1. A peripheral device adapted to receive a plurality of types of portable recording media, wherein one of said plurality of types of portable recording media is a recording medium for storing user data and another one of said plurality of types of portable recording media is a recording medium bearing update data for automatically updating a program of the peripheral device, comprising:

a first microprocessor;

a first rewritable program memory connected to said first microprocessor for storing a program to be executed by said first microprocessor;

a medium loader for loading a portable recording medium;

means for reading data from said portable recording medium loaded in said medium loader;

a data memory for storing data read from said portable recording medium loaded in said medium loader;

a first bus connected to said first microprocessor, said first program memory, said data reading means, and said data memory, said first microprocessor controlling said medium loader via said first bus;

a second microprocessor;

a second program memory connected to said second microprocessor for storing a program to be executed by said second microprocessor; and a second bus connected to said second microprocessor, said second program memory, and said data memory, wherein:

when said first microprocessor detects that said portable recording medium has been loaded in said medium loader, said first microprocessor judges whether said portable recording medium is a recording medium bearing update data for updating said program;

if said portable recording medium is a recording medium bearing update data for updating said program, said first microprocessor reads the update data from said portable recording medium, stores the read update data in said data memory, and thereafter releases said first bus;

said second microprocessor updates said program stored in said first program memory via said first and second buses, in accordance with said update data stored in said data memory, and thereafter terminates the release of said first bus.

2. A peripheral device according to claim 1, wherein an identification code for identifying that said portable recording medium is a recording medium bearing update data for updating said program is recorded in said portable recording medium, said first microcomputer reading said identification code and judging from the read identification code whether said portable recording medium is a recording medium bearing update data for updating said program.

3. A peripheral device according to claim 1, wherein a discriminator for indicating that said portable recording medium is a recording medium bearing update data for updating said program is formed on a housing of said portable recording medium, said first microcomputer detecting said discriminator and judging from the detected discriminator whether said portable recording medium is a recording medium bearing update data for updating said program.

4. A peripheral device according to claim 1, wherein if said first microprocessor judges that said portable recording medium is not a recording medium bearing update data for updating said program, said first microprocessor ejects said portable recording medium from said medium loader.

5. A peripheral device according to claim 1, wherein, if said portable recording medium is a recording medium bearing update data for updating said program, said first microprocessor reads a revision of a program to be updated from said portable recording medium, compares the read revision with a revision of said program stored in said program memory, and if both of said revisions coincide, reads said update data from said portable recording medium and stores the read update data in said data memory.

6. A peripheral device according to claim 5, wherein if both of said revisions do not coincide, said first microprocessor ejects said portable recording medium from said medium loader.

7. A peripheral device according to claim 1, wherein a plurality of data sets, each same as said update data, are stored in said portable recording medium, if said portable recording medium is a recording medium bearing update data for updating said program, said first microprocessor reading said plurality of data sets from said portable recording medium, comparing said plurality of data sets, and storing, if said plurality of data sets coincide, said update data in said data memory.

8. A peripheral device according to claim 7, wherein if said plurality of data sets do not coincide, said first microprocessor ejects said portable recording medium from said medium loader.

9. A peripheral device according to claim 1, wherein said second program memory is a rewritable memory, and said first processor updates said program stored in said second program memory via said first and second buses in accordance with said update data stored in said data memory.

\* \* \* \* \*